(12) United States Patent
Tokuda et al.

(10) Patent No.: US 7,550,918 B2
(45) Date of Patent: Jun. 23, 2009

(54) DISPLAY DEVICE

(75) Inventors: Naoki Tokuda, Mobara (JP); Toshihiro Sato, Mobara (JP); Hajime Akimoto, Kokubunji (JP); Hiroshi Kageyama, Hachioji (JP)

(73) Assignee: Hitachi Displays, Ltd., Chiba (JP)

( * ) Notice: Subject to any disclaimer, the term of this patent is extended or adjusted under 35 U.S.C. 154(b) by 378 days.

(21) Appl. No.: 10/962,481

(22) Filed: Oct. 13, 2004

(65) Prior Publication Data

US 2005/0082969 A1 Apr. 21, 2005

(30) Foreign Application Priority Data

Oct. 21, 2003 (JP) .............................. 2003-360110

(51) Int. Cl.
*H01J 1/62* (2006.01)
(52) U.S. Cl. ..................... 313/505; 313/506; 313/500
(58) Field of Classification Search .................. 313/500, 313/505, 506, 504
See application file for complete search history.

(56) References Cited

U.S. PATENT DOCUMENTS

| | | | |
|---|---|---|---|
| 5,882,761 A | 3/1999 | Kawami et al. | |
| 6,084,579 A * | 7/2000 | Hirano | 345/205 |
| 6,111,357 A | 8/2000 | Fleming et al. | |
| 6,590,337 B1 * | 7/2003 | Nishikawa et al. | 313/509 |
| 6,621,213 B2 * | 9/2003 | Kawashima | 313/506 |
| 6,633,134 B1 * | 10/2003 | Kondo et al. | 313/504 |
| 6,844,672 B2 * | 1/2005 | Yamazaki | 313/504 |
| 6,867,541 B2 | 3/2005 | Okuyama et al. | |
| 6,965,363 B2 | 11/2005 | Sato et al. | |
| 7,023,407 B2 | 4/2006 | Nakanishi | |
| 7,154,218 B2 * | 12/2006 | Murakami et al. | 313/506 |
| 7,364,939 B2 | 4/2008 | Yudasaka | |
| 2002/0047555 A1 * | 4/2002 | Inukai | 315/169.3 |
| 2003/0015961 A1 * | 1/2003 | Yamazaki | 313/504 |
| 2004/0256979 A1 * | 12/2004 | Murakami et al. | 313/503 |
| 2004/0256984 A1 * | 12/2004 | Fuchigami et al. | 313/506 |
| 2006/0292955 A1 * | 12/2006 | Kang et al. | 313/506 |
| 2007/0216298 A1 * | 9/2007 | Kaneko | 313/512 |

FOREIGN PATENT DOCUMENTS

| | | |
|---|---|---|
| JP | 09-148066 | 11/1995 |
| JP | 2000-036381 | 7/1999 |

(Continued)

*Primary Examiner*—Peter Macchiarolo
(74) *Attorney, Agent, or Firm*—Reed Smith LLP; Juan Carlos A. Marquez, Esq.

(57) ABSTRACT

The present invention provides an organic EL display device which imparts the flexibility to the pull-around operation of lines. The organic EL display device is characterized in that the display device includes a display part and a display drive circuit which is formed on a periphery of the display part on a surface of a substrate, wherein the display part includes a plurality of pixels driven by the display drive circuit, each one of the pixels is formed of a stacked body which is constituted of at least one electrode, a light emitting layer and another electrode stacked from the substrate side, another electrodes of respective pixels are electrically connected in common, and a conductive layer which is formed on the same layer and is made of the same material as another electrodes is formed on a region other than the display region in a state that the conductive layer is electrically separated from another electrodes.

9 Claims, 6 Drawing Sheets

FOREIGN PATENT DOCUMENTS

| | | |
|---|---|---|
| JP | 2001-102169 | 10/1999 |
| JP | 2002-287663 | 3/2001 |
| JP | 2003-076298 | 9/2001 |
| JP | 2003-288986 | 1/2003 |
| WO | WO 99/10862 | 3/1999 |

\* cited by examiner

DISPLAY DEVICE

BACKGROUND OF THE INVENTION

1. Field of the Invention

The present invention relates to a display device, and more particularly to an organic EL (Electro Luminescence) display device, for example.

2. Description of the Related Art

An organic EL display device is configured such that a plurality of pixels which are arranged in a matrix array are formed within a display part on a substrate, each one of these pixels is formed of a stacked body which is constituted by stacking at least one electrode, a light emitting layer and another electrode from the substrate side, and an electric current is supplied to the light emitting layer through the electrode thus allowing the light emitting layer to emit light (see Japanese Patent Laid-open Patent Publication 2000-36381, Japanese Patent Laid-open Patent Publication Hei9 (1997)-148066).

Further, a so-called active-matrix type display device includes, at least, gate signal lines which are formed along pixel groups each of which is constituted of pixels arranged in parallel in one direction, switching transistors for every pixel which are turned on in response to scanning signals from the gate signal lines, drain signal lines which are formed along pixel groups each of which is constituted of pixels which are arranged in parallel in the direction which intersects the above-mentioned one direction, drive transistors which control the video signals from the drain signal lines by way of the switching transistors, and current supply lines which supply an electric current to the above-mentioned one electrodes by way of the drive transistor.

Here, although the electric current flows into another electrodes from one electrodes through the light emitting layers, another electrodes are formed in common with respective pixels, that is, another electrodes are formed of a conductive film which is formed over the whole region of a display part which is a mass of the respective pixels (see Japanese Patent Laid-open Patent Publication Hei10(1998)-319909).

SUMMARY OF THE INVENTION

However, in such an organic EL display device display device, the above-mentioned another electrode out of respective material layers stacked on the substrate is positioned at a portion close to an uppermost layer and hence, conventionally, signal lines or wiring layers which are formed within the pixel or in the vicinity of the pixel are formed below the above-mentioned another electrode.

Accordingly, in the layout of the lines or the like, it has been requested to provide the tolerance in space. This is because that the formation of the wiring layers or the like in the limited layers inevitably requires the increase of an area of the organic EL display device.

To satisfy such a requirement, it may be possible to increase the number of layers as compared with the conventional constitution and the above-mentioned wiring layer is allocated as one of these layers. However, this brings about drawbacks such as the increase of the manufacturing man-hours and hence is not favorable.

The present invention has been made under such circumstances and it is an object of the present invention to provide an organic EL display device which can largely increase the freedom of the arrangement of wiring or the like without increasing the manufacturing man-hours.

To briefly explain the summary of representative inventions among inventions disclosed in this specification, they are as follows.

Means 1.

A display device according to the present invention is characterized in that the display device includes a display part and a display drive circuit which is formed on a periphery of the display part on a surface of a substrate, wherein the display part includes a plurality of pixels driven by the display drive circuit, each one of the pixels is formed of a stacked body which is constituted of at least one electrode, a light emitting layer and another electrode stacked from the substrate side, another electrodes of respective pixels are electrically connected in common, and a conductive layer which is formed on the same layer and is made of the same material as another electrodes is formed on a region other than the display region in a state that the conductive layer is electrically separated from another electrodes.

Means 2.

A display device according to the present invention is, for example, on the premise of means 1, characterized in that the conductive layer is formed over the display drive circuit by way of an insulation film in a state that a portion of the conductive layer is overlapped to the display drive circuit.

Means 3.

A display device according to the present invention is, for example, on the premise of means 1, characterized in that the conductive layer is formed over the display drive circuit by way of an insulation film in a state that a portion of the conductive layer is not overlapped to the display drive circuit.

Means 4.

A display device according to the present invention is, for example, on the premise of means 1, characterized in that the conductive layer is formed over the display drive circuit by way of an insulation film in a state that the conductive layer is not overlapped to the display drive circuit.

Means 5.

A display device according to the present invention is, for example, on the premise of any one of means 1 to 4, characterized in that the conductive layer is formed of a wiring layer.

Means 6.

A display device according to the present invention is, for example, on the premise of any one of means 1 to 4, characterized in that the conductive layer also functions as one electrode of a capacitive element.

Means 7.

A display device according to the present invention is characterized in that the display device includes a display part and a display drive circuit which is formed on a periphery of the display part on a surface of a substrate, wherein the display part includes a plurality of pixels driven by the display drive circuit, each one of the pixels is formed of a stacked body which is constituted of at least one electrode, a light emitting layer and another electrode stacked from the substrate side, another electrodes of respective pixels are electrically connected in common, and a conductive layer which is formed on the same layer and is made of the same material as another electrodes is formed on a region of the display region in a state that the conductive layer is electrically separated from another electrodes.

Means 8.

A display device according to the present invention is, for example, on the premise of means 7, characterized in that the conductive layer is formed of a wiring layer.

Means 9.

A display device according to the present invention is, for example, on the premise of means 7, characterized in that the conductive layer also functions as one electrode of a capacitive element.

Means 10.

A display device according to the present invention is characterized in that the display device includes a display part on a surface of a substrate, the display part includes a plurality of pixels, and each one of the pixels is formed of a stacked body which is constituted of at least one electrode, a light emitting layer and another electrode stacked from the substrate side, an electric current is supplied to one electrodes through current supply lines and, at the same time, the current supply lines are positioned below another electrodes by way of an insulation layer, and another electrodes are formed in a state that another electrodes are prevented from being overlapped to the current supply lines.

Here, the present invention is not limited to the above-mentioned constitution and various modifications are conceivable without departing from the technical concept of the present invention.

According to the above-mentioned means 1, in the periphery of other electrodes of the respective light emitting layers which are formed to cover the whole region of the display part, the conductive layer is formed besides these electrodes and hence, it is possible to impart the flexibility to the pull-around operation of lines or the like of circuits in the periphery of the display part using the conductive layer. Further, the conductive layer can be formed simultaneously with other electrodes and hence, it is possible to have an advantageous effect that there is no increase of the manufacturing man-hours.

According to the constitution of the above-mentioned means 2, it is possible to form the conductive layer without ensuring any particular regions in the formation of the conductive layer.

According to the constitution of the above-mentioned means 3, when the lines attributed to the conductive layer become complicated, some lines may be slightly projected from the region where the display drive circuit is formed. Also in this case, it is possible to perform the spatially advantageous pull-around operation of the lines.

According to the constitution of the above-mentioned means 4, even when the wiring layer or the like which is formed of the above-mentioned conductive film or the like is formed in a state that the wiring lines or the like formed of the above-mentioned conductive layers or the like are not overlapped to the display drive circuit, it is possible to form the wiring layers or the like simultaneously with other electrodes and hence, it is possible to obtain an advantageous effect that there is no increase of the manufacturing man-hours.

According to the constitution of the above-mentioned means 5, the conductive layer is formed of a wiring layer and the wiring layer can be separately formed from other layers which are formed below the layer thus imparting the flexibility to the pull-around operation of the lines.

According to the constitution of the means 6, by allowing the conductive layer to perform also as another electrode of the capacitive element, it is possible to impart the flexibility to the locations where the capacitive elements are arranged.

According to the constitution of the means 7, for example, the wiring layer or the like can be formed on the same layer as other electrodes even within the region of the display part and hence, it is possible to impart the flexibility to the formation of the wiring layers or the like within the display part.

According to the constitution of the above-mentioned means 8, the conductive layer is formed of a wiring layer and the wiring layer can be separately formed from other layers which are formed below the layer thus imparting the flexibility to the pull-around operation of the lines.

According to the constitution of the means 9, for example, by allowing the conductive layer to perform also as another electrode of the capacitive element, it is possible to impart the flexibility to the locations where the capacitive elements are arranged.

According to the constitution of the means 10, it is possible to largely reduce the parasitic capacitance which is generated between another electrode of the light emitting layer of each pixel and the current supply line.

BRIEF DESCRIPTION OF THE DRAWINGS

FIGS. 10A and 10B are explanatory views showing another embodiment of the constitution in a region of a pixel of the organic EL display device according to the present invention.

DETAILED DESCRIPTION

Embodiments of an organic EL display device according to the present invention are explained hereinafter in conjunction with drawings.

Figure 1:
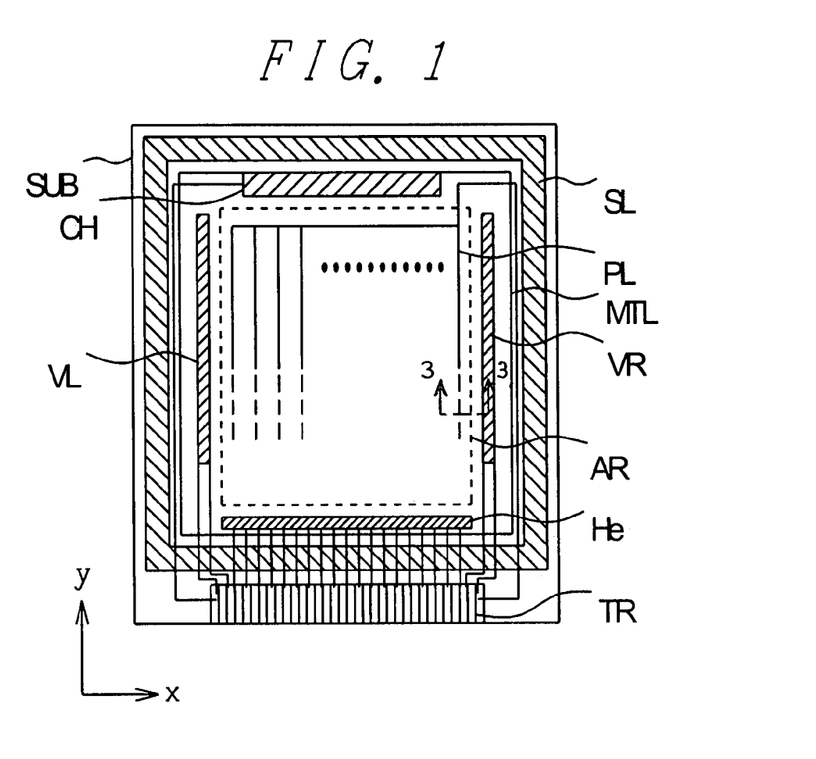
FIG. 1 is a plan view showing one embodiment of an organic EL display device according to the present invention.

FIG. 1 is a schematic plan view showing one embodiment of the constitution of the organic EL display device according to the present invention. First of all, there is provided a transparent substrate SUB which is formed of, for example, a rectangular glass plate.

A display part AR is formed on a center portion of the transparent substrate SUB except for a slight periphery thereof. Although the constitution of the display part AR is described in detail later, a plurality of pixels are arranged in a matrix array, for example, and a plurality of signal lines which run in the x direction as well as in the y direction are formed on boundaries of the respective pixels.

Then, scanning signal drive circuits VL, VR are formed at both sides, that is, at the left and right sides of the display part AR in a state that the display part AR is sandwiched between the drive circuits VL, VR. The scanning signal drive circuits VL, VR are connected with a plurality of gate signal lines GL (not shown in the drawing) which extend in the direction x and are arranged in parallel in the direction y within the display part AR, wherein scanning signals are sequentially supplied to the respective gate signal lines GL.

Further, a data signal drive circuit He is formed on a lower side of the display part AR and also in the vicinity of the display part AR. The data signal drive circuit He is connected with a plurality of data signal lines DL (not shown in the drawing) which extend in the direction y and are arranged in parallel in the direction x within the display part AR, wherein data signals are supplied to these respective data signal lines DL at the timing of the supplying of the scanning signals.

Further, within the display part AR, current supply lines PL are arranged besides the gate signal lines GL and the data signal lines DL. The current supply lines PL are, for example, constituted of a plurality of signal lines which extend in the direction y and are arranged in parallel in the direction x. These current supply lines PL are connected in common at an upper side in the drawing and, thereafter, are made to pass along a side of the right-side scanning signal drive circuit VR, for example, and are pulled around to a terminal portion TR described later.

Then, on the transparent substrate SUB, a sealing portion SL for sealing is formed such that the sealing portion SL for sealing surrounds respective regions where the display part AR, the scanning signal drive circuits VL, VR and the video signal drive circuit He are formed. The sealing portion SL for sealing functions as a sealing material for fixing the transparent substrate SUB and the another substrate which differs from the transparent substrate SUB1 in a state that these substrates face each other. Since the organic EL (light emitting layers) which are formed in the respective pixels are deteriorated due to oxygen and moisture, the sealing portion SL for sealing is provided for shielding the organic EL from the outside air.

On a lower side of the transparent substrate SUB and outside the sealing portion SL for sealing, the terminal portion TR is formed. An electric current is supplied to the above-mentioned current supply lines PL from the terminal portion TR and hence, the signals are supplied to the scanning signal drive circuits VL, VR and the video signal drive circuit He respectively.

Here, although the signal lines, the pixels and the circuits which are formed on a surface of the transparent substrate are constituted of a stacked body which is formed of a conductive layer, a semiconductor layer and an insulation film, as an uppermost layer or as a layer which is close to the uppermost layer, a plate-like conductive layer MTL which covers not only the display part AR but also scanning signal drive circuits VL, VR and the video signal data drive circuit He is formed. The conductive layer MTL constitutes another electrode at a ground side of the organic EL (light emitting layers) of each pixel, while one electrode of each pixel is connected with the current supply line PL.

Here, the reason that the conductive layer MTL is configured to also cover the scanning signal drive circuits VL, VR and the video signal data circuit He is to impart also the light shielding function to the conductive layer MTL. Due to the provision of the conductive layer MTL, it is possible to prevent light from being radiated to semiconductor layers formed in the respective pixels of the display part AR, the scanning signal drive circuits VL, VR and the video signal data circuit He respectively.

Accordingly, the conductive layer MTL is, for example, made of metal such as Al or the like, and light from the organic EL of each pixel is radiated to the outside through the transparent substrate SUB. In other words, a viewer watches the display part AR with naked eyes from and by way of the transparent substrate SUB side. Accordingly, as a material of one electrode which is formed on a light emitting layer in a stacked manner, to impart the light transmitting property to the electrode, for example, a material such as ITO (Indium Tin Oxide), ITZO (Indium Tin Zinc Oxide), IZO (Indium Zinc Oxide), $SnO_2$ (tin oxide), $In_2O_3$ (indium oxide) can be selected.

Here, the conductive layer MTL is also connected with the signal lines through contact holes CH which are formed above the display part AR and within the sealing portion SL for sealing and these signal lines are pulled out to the terminal portion TR passing along the side of the left-side scanning signal drive circuit VL.

Figure 2:
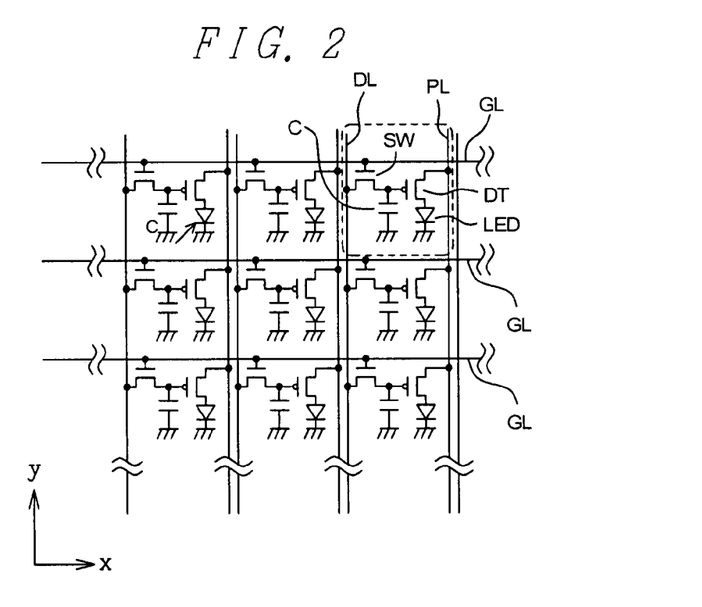
FIG. 2 is a view showing a circuit of a display part of the organic EL display device according to the present invention.

FIG. 2 is an equivalent circuit diagram showing one embodiment of the display part AR of the above-mentioned organic EL display device. A portion indicated by a dotted frame in the drawing corresponds to one pixel. Although FIG. 2 is the equivalent circuit diagram, the drawing is depicted corresponding to an actual geometric arrangement of the pixel.

In FIG. 2, first of all, there are provided the gate signal lines GL which extend in the direction x and are arranged in parallel in the direction y, the data signal lines DL which extend in the direction y and are arranged in parallel in the direction x, and the current supply lines PL which are respectively arranged close to the respective data signal lines DL, extend in the direction y and are arranged in parallel in the direction x.

Here, a region which is defined between the respective gate signal lines GL and also is defined between the data signal lines DL at the left side in the drawing and the current supply lines PL at the right side in the drawing is configured to constitute a pixel region.

Each pixel region includes a switching transistor SW which is turned on due to the supply of the scanning signal from the one-side gate signal lines GL (the upper side in the drawing) and also a capacitive element C to which the data signal is supplied from the one-side data signal lines DL through the switching transistor SW turned on. Another end of the capacitive element C is grounded. A charge corresponding to the data signal stored in the capacitive element C is supplied to a gate of a drive transistor DT and an electric current flows from the current supply line PL in response to an amount of the charge. The drive transistor DT is connected in series with an organic EL element LED which has one end thereof grounded and the organic EL element LED emits light when the electric current flows into the organic EL element LED.

Figure 3:
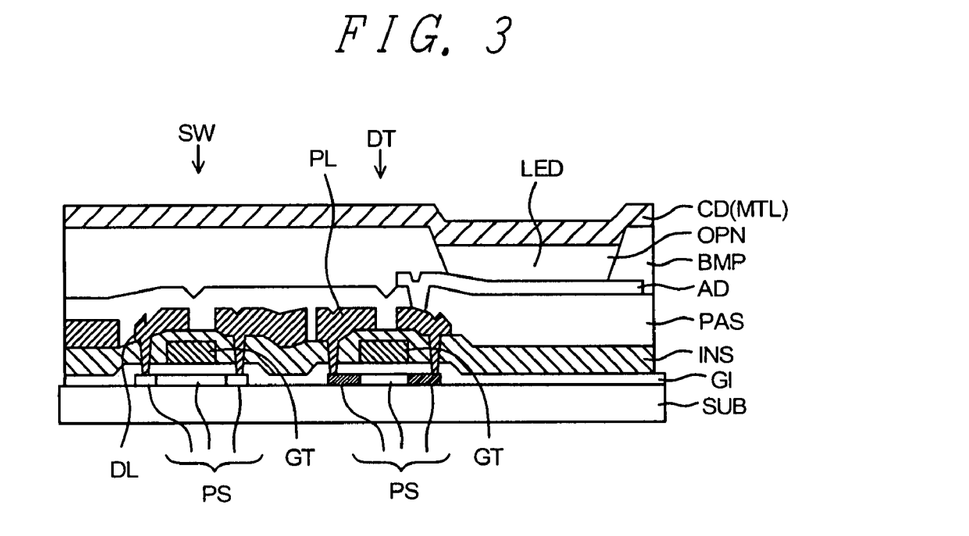
FIG. 3 is a cross-sectional view showing one embodiment of the constitution in a region of a pixel of the organic EL display device according to the present invention.

FIG. 3 is a view showing a cross section of a portion corresponding to one pixel of the display part AR. The direction of the cross-section is depicted by the broken line 3-3 in FIG. 1.

In the drawing, there is provided the transparent substrate SUB and, first of all, the switching transistor SW and the drive transistor DT are formed on a surface of the transparent substrate SUB.

The switching element SW and the drive transistor DT adopt a semiconductor formed of polysilicon (p-Si), for example, as a semiconductor thereof and have the substantially same constitution.

That is, the semiconductor layers PS made of polysilicon are formed on regions on the transparent substrate SUB where the semiconductor layers PS are to be formed, and a first insulation film G1 is formed on the transparent substrate SUB such that the first insulation film G1 also covers the semiconductor layers PS. The first insulation film G1 functions as a gate insulation film in the regions where the respective transistors are formed.

Gate electrodes GT are formed on the first insulation film G1 such that the gate electrodes GT traverse center portions of the respective semiconductor layers PS. The gate electrodes GT are integrally formed with the gate signal lines GL which are formed on the same layer as the gate electrodes GT.

Here, in the manufacturing steps, after forming the gate electrodes GT, the semiconductor layers PS are doped with impurities using the gate electrode GT as a mask thus forming a drain region and a source region in each transistor.

Then, a second insulation film INS is formed on the transparent substrate SUB such that the second insulation film INS also covers the gate electrodes GT and the gate signal lines GL. The second insulation film INS functions as an interlayer insulation film for data signal lines DL described later and the current supply lines PL against the gate signal lines GL.

The data signal lines DL are, in the region where the switching transistor SW is formed, connected with the drain region of the switching transistor SW via a through hole which penetrates the second insulation film INS and the first insulation film G1 which are disposed below the data signal lines DL. Further, current supply lines PL are, in the region where the drive transistor DT is formed, connected with the drain region of the drive transistor DT via a through hole which penetrates the second insulation film INS and the first insulation film G1 which are disposed below the current supply lines PL.

Here, source electrode of the switching transistor SW is pulled out onto the second insulation film INS via a through hole which penetrates the second insulation film INS and the first insulation film G1 and is connected with the gate electrode GT of the drive transistor DT via a through hole formed in the second insulation film INS.

The source electrode of the drive transistor DT is formed via a through hole which penetrates the second insulation film INS and the first insulation film G1 and this electrode is pulled out to one electrode of the light emitting layer which will be explained later.

On the surface of the transparent substrate SUB on which the data signal lines DL, the current supply lines PL and the like are formed, a third insulation film PAS is formed such that the third insulation film PAS also covers the data signal lines DL, the current supply lines PL and the like.

Then, on a surface of the third insulation film PAS, electrodes AD which are connected with the source electrodes of the drive transistors DT via through holes formed in the third insulation film PAS are formed. This electrode AD constitutes one electrode of the organic EL (light emitting layer) described later and is made of a light transmitting conductive material such as ITO (Indium Tin Oxide), ITZO (Indium Tin Zinc Oxide), IZO (Indium Zinc Oxide), $SnO_2$ (tin oxide), $In_2O_3$ (indium oxide), for example.

Further, a so-called bank layer BMP is formed in such a manner that a portion of the electrode AD is exposed. The bank layer BMP is formed of resin or the like, for example. In the manufacturing steps, the bank layer BMP has a function of stacking the light emitting layer formed of the organic EL having fluidity at a fixed position on the electrode AD.

In other words, in an opening OPN formed in the bank layer BMP, the light emitting layer LED is formed on a surface of the electrode AD exposed from the opening OPN such that the light emitting layer LED is embedded on the electrode AD. Here, the light emitting layer LED may be formed by stacking a hole transport layer, an electron transport layer and the like in addition to the organic EL. In such a case, in this specification, the light emitting layer is construed as a concept which includes the hole transport layer, the electron transport layer and the like.

Then, on upper surfaces of the bank layer BMP and the light emitting layers LED which are embedded in the opening formed in the bank layer BMP, the conductive layer MTL is formed. Assuming the above-mentioned electrode AD as one electrode of the light emitting layer LED, this electrode AD corresponds to another electrode CD and is formed such that the light emitting layer LED is sandwiched by the electrode AD and the conductive layer MTL.

The conductive layer MTL is also formed on the neighboring pixel in common and hence, the conductive layer MTL is formed in such a manner that the conductive layer MTL extends over a surface of the bank layer BMP. Further, the conductive layer MTL is formed of a non light-transmitting material made of metal such as Al or the like. As a result, light radiated from the light emitting layer LED is radiated through the light transmitting electrode AD, the transparent substrate SUB and the like.

Figure 4:
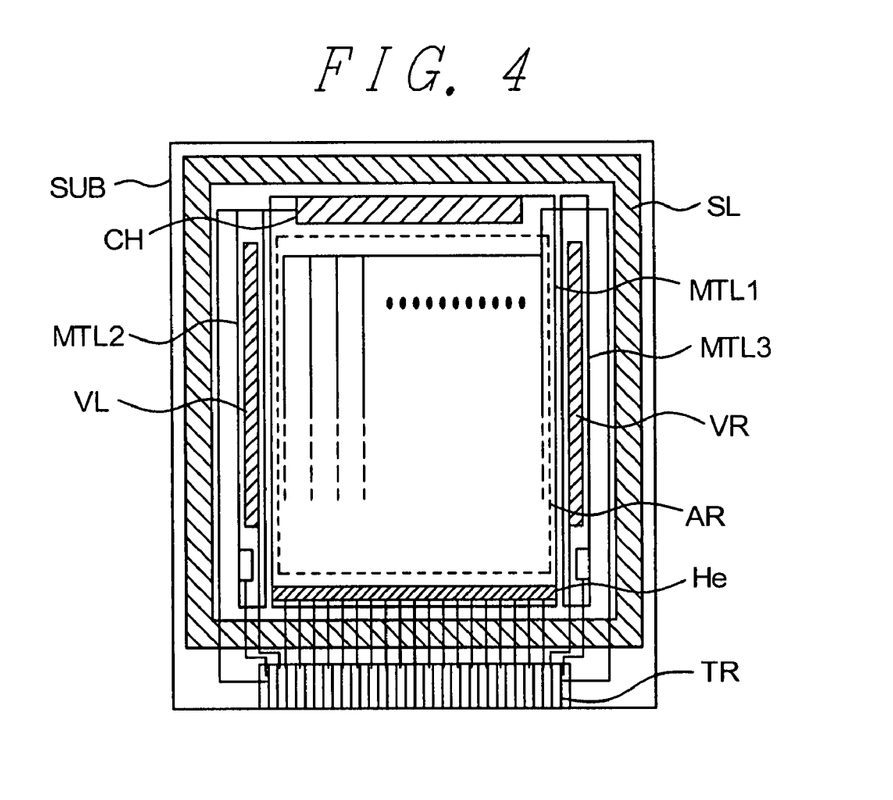
FIG. 4 is a plan view showing another embodiment of the organic EL display device according to the present invention.

FIG. 4 is a plan view showing another embodiment of the organic EL display device according to the present invention and is a view corresponding to FIG. 1.

The constitution which makes this embodiment different from the embodiment shown in FIG. 1 lies in a conductive layer MTL(CD). That is, all of a conductive layer MTL1 which is formed such that the conductive layer MTL1 covers the display part AR and the video signal drive circuit He, a conductive layer MTL2 which is formed such that the conductive layer MTL2 covers the scanning signal drive circuit VL arranged at the left side, and a conductive layer MTL3 which is formed such that the conductive layer MTL3 covers the scanning signal drive circuit VR arranged at the right side are formed on the same layer and are formed of the same material layer, while these conductive layers MTL1, MTL2 and MTL3 are physically separated from each other.

Here, a potential is imparted to the conductive layer MTL1 which is formed such that the conductive layer MTL1 covers the display part AR and the video signal drive circuit He as one electrode of the light emitting layers LED of respective pixels of the display part AR. On the other hand, the conductive layer MTL2 which is formed such that the conductive layer MTL2 covers the scanning signal drive circuit VL arranged at the left side, and the conductive layer MTL3 which is formed such that the conductive layer MTL3 covers the scanning signal drive circuit VR arranged at the right side function as ground lines, function as ground lines for example.

In this case, the respective conductive layers MTL2, MTL3 which are formed such that the conductive layers MTL2, MTL3 cover the respective scanning signal drive circuits VL, VR may be used as lines of the corresponding scanning signal drive circuits VL, VR without being used as the ground lines. That is, as connections in the inside of the scanning signal drive circuits VL, VR, besides lines which are formed in layers other than the uppermost layer or the layer close to the uppermost layer, the above-mentioned conductive layers MTL2, MTL3 may be used. In connecting these conductive layers MTL2, MTL3 with other wiring layers, it is necessary to form the through holes. However, in this case, it is possible to obtain several advantageous effects including an advantageous that an area which the scanning signal drive circuits VL, VR occupy can be reduced.

In view of the above, it is unnecessary to form the conductive layer MTL2, MTL3 such that the conductive layer MTL2, MTL3 cover the scanning signal drive circuits VL, VR and it may be sufficient that the conductive layers MTL2, MTL3 may be overlapped to portions of the scanning signal drive circuits VL, VR.

In short, it is sufficient if at least the conductive layer MTL1 which covers the display part AR is formed, other conductive layer MTL2 and the like which are formed on the same layer as the conductive layer MTL1 and are made of the same material as the conductive layer MTL1 are electrically separated from each other, and other conductive layer MTL2 and the like are used for other applications.

Figure 5:
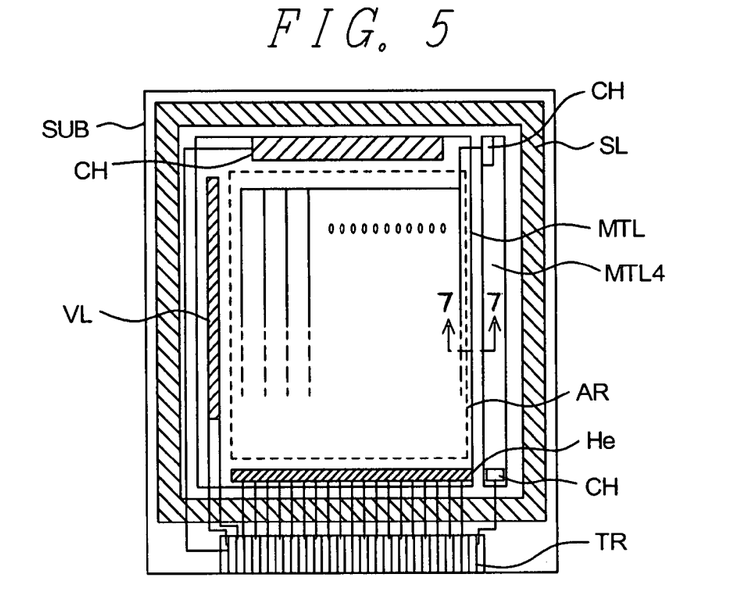
FIG. 5 is a plan view showing another embodiment of the organic EL display device according to the present invention.

FIG. 5 is a plan view showing another embodiment of the organic EL display device according to the present invention and is a view corresponding to FIG. 1.

The constitution which makes this embodiment different from the embodiment shown in FIG. 1 lies in the conductive layer MTL. In this embodiment, portions of the conductive layer MTL which cover the display part AR, the left-side scanning signal drive circuit VL and the video signal drive circuit He are integrally formed, while on the right side of the display part AR, a conductive layer MTL4 which extends in the direction y in the drawing is formed separately from the above-mentioned conductive layer MTL.

Further, the scanning signal drive circuit VR is not formed below the conductive layer MTL4 and the supply of the scanning signals to the respective gate signal lines GL is all performed by the left-side scanning signal drive circuit VL.

Further, the conductive layer MTL4 is also made to function as a wiring layer for supplying an electric current to the respective current supply lines PL from the terminal TR.

In this case, since the current supply lines PL and the wiring layer from the terminal TR are positioned below the conductive layer MTL4 by way of the insulation film, the current supply lines PL and the wiring layer are electrically connected with each other via through holes formed in the insulation film.

Figure 6:
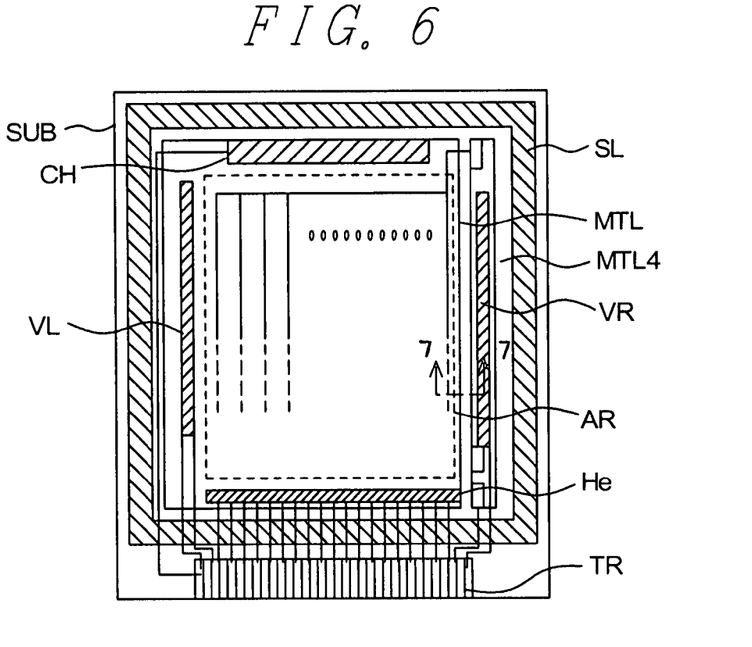
FIG. 6 is a plan view showing another embodiment of the organic EL display device according to the present invention.

FIG. 6 is a plan view showing another embodiment of the organic EL display device according to the present invention and is a view corresponding to FIG. 5.

The constitution which makes this embodiment different from the embodiment shown in FIG. 5 lies in that the conductive layer MTL4 is made to function as a wiring layer for supplying an electric current from the terminal TR to the respective current supply lines PL and, at the same time, the right-side scanning signal drive circuit VR is arranged below the conductive layer MTL4.

Further, the conductive layer MTL4 has a portion thereof constituted to function as one electrode of a capacitive element. That is, an insulation film which constitutes a dielectric film is formed below the conductive layer MTL4 and a wiring layer which functions as another electrode of the capacitive element is formed below the insulation film.

Figure 7:
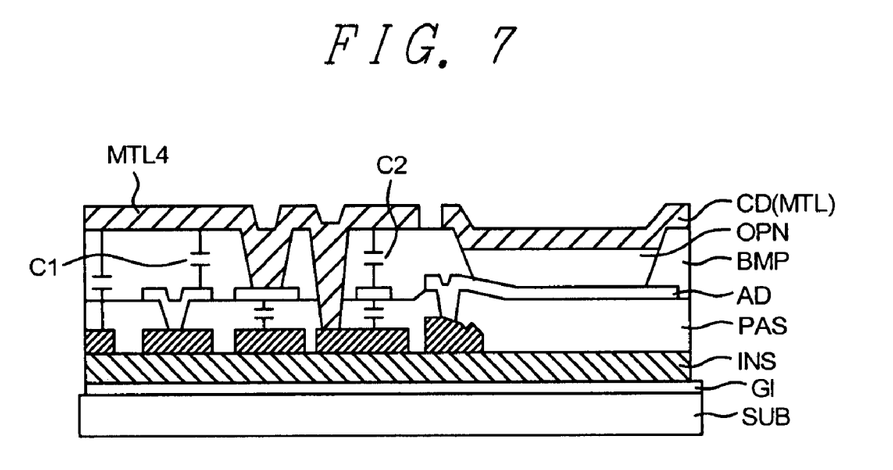
FIG. 7 is a cross-sectional view showing another embodiment of the constitution in a region of a pixel of the organic EL display device according to the present invention.

FIG. 7 is a cross-sectional view of a portion of the conductive film which constitutes one electrode of the capacitive element and corresponds to FIG. 3. The direction of the cross-section is depicted by the broken lines 7-7 in FIGS. 5 and 6.

In this case, a dielectric film of the capacitive element is constituted by making use of the bank layer BMP. That is, the capacitive elements C1, C2 and the like are formed between the conductive layer which is formed on an upper layer of the third insulation film PAS and the conductive layer MTL4 which is formed in a state that the conductive layer MTL4 sandwiches the bank layer BMP with the conductive layer.

Figure 8:
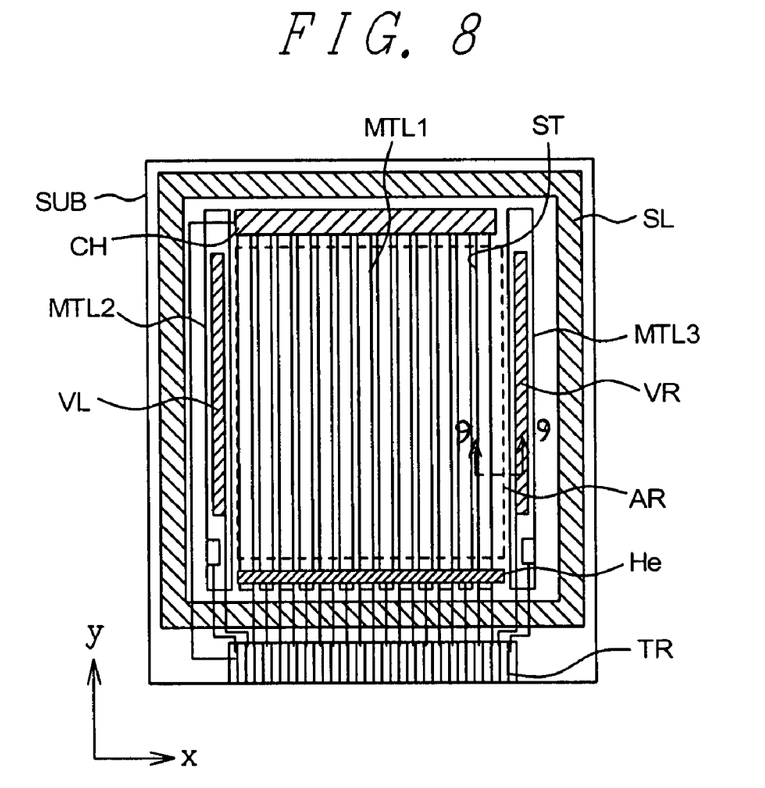
FIG. 8 is a plan view showing another embodiment of the organic EL display device according to the present invention.

FIG. 8 is a plan view showing another embodiment of the organic EL display device according to the present invention and is a view corresponding to FIG. 4.

The constitution which makes this embodiment different from the embodiment shown in FIG. 4 lies in the conductive layer MTL1 which covers the display part AR. That is, in the conductive layer MTL1, slits ST are formed along the direction y in the drawing and these slits ST are arranged in parallel in the direction x in the drawing.

Here, there exists the positional relationship that the above-mentioned current supply lines PL are formed below portions where these respective slits ST are formed thus providing the constitution in which the overlapping of the current supply lines PL and the conductive film MTL1 is avoided.

Due to such a constitution, it is possible to provide the constitution which can largely reduce the parasitic capacitance which is generated between the current supply lines PL and the conductive layer MTL1.

Figure 9:
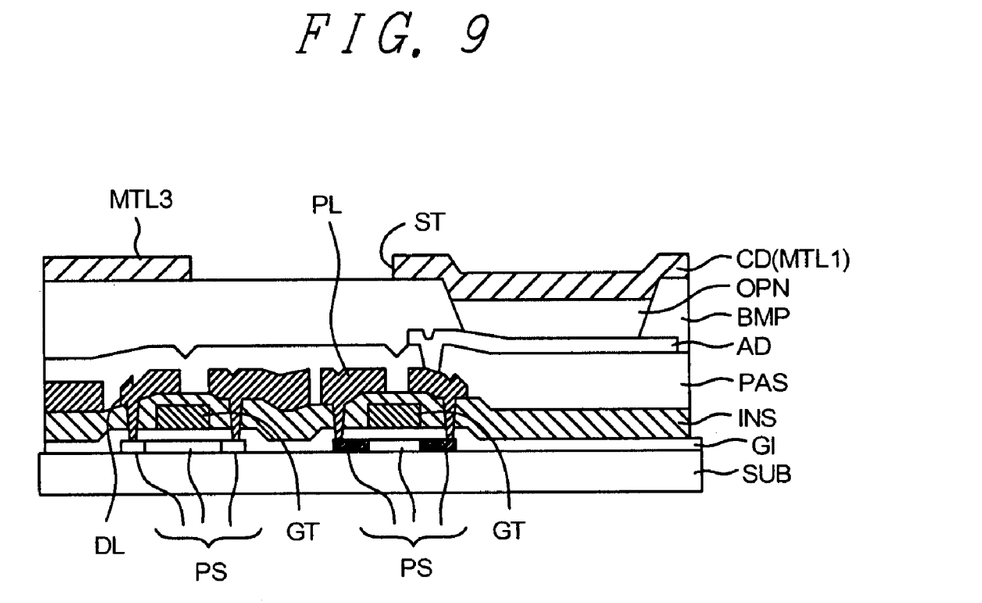
FIG. 9 is a cross-sectional view showing another embodiment of the constitution in a region of a pixel of the organic EL display device according to the present invention.

FIG. 9 is a cross-sectional view of the portion of the conductive layer MTL1 where the slits ST are formed and corresponds to FIG. 3. The direction of the cross-section is depicted by the broken lines 9-9 in FIG. 8.

Here, it is needless to say that, in this embodiment having such a constitution, the conductive layer MTL1 which covers the display part AR may be connected with the conductive layer MTL2 which covers the left-side scanning signal drive circuit VL or the conductive layer MTL3 which covers the right-side scanning signal drive circuit VR. In other words, on the premise of the constitution shown in FIG. 1, the slits ST which avoid the overlapping with the current supply lines PL and conductive layer MTL may be formed in the conductive layer MTL.

Although the explanation has been made with respect to the organic EL display device which is provided with two transistors in one pixel in the above-mentioned respective embodiments, it is needless to say that the present invention is directly applicable to the organic EL display device which is provided with four transistors in one pixel. This is because that although the circuits which drive the respective pixels may become slightly complicated, the other circumstances including the constitution and the manner of operation are equal.

Figure 10A:
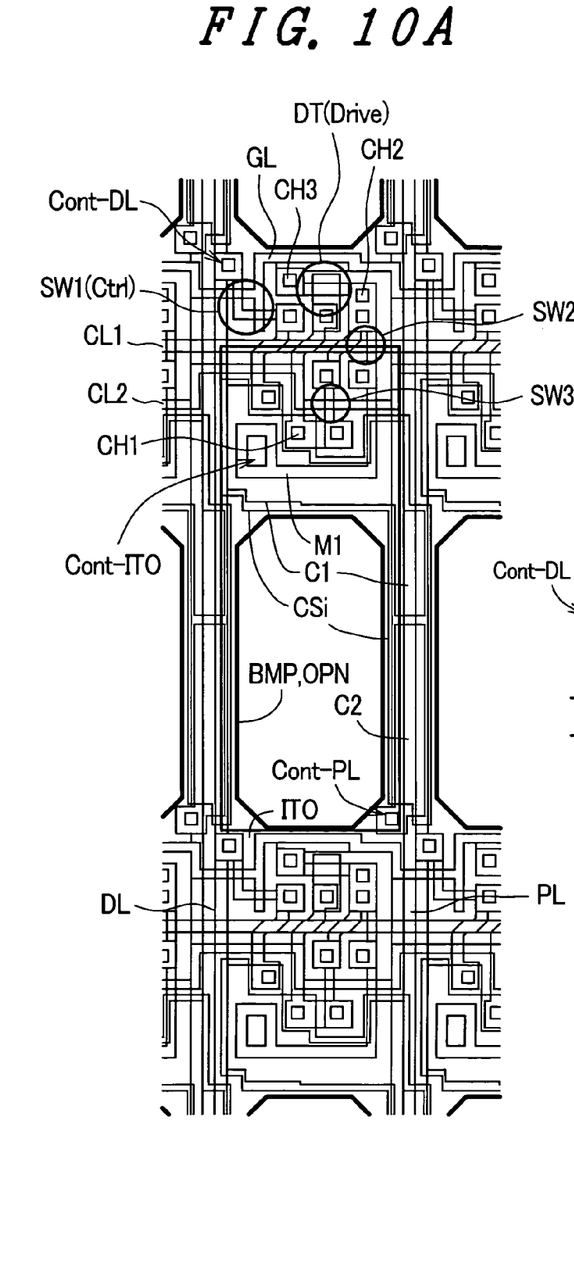
FIG. 10A shows a plan view of the respective pixel.

One embodiment of the constitution of the pixel provided with four transistors in one pixel is shown in FIG. 10A. In FIG. 10A, one pixel has an upper side thereof defined by a gate signal line GL which selectively drives the pixel, a left side thereof defined by a data signal line DL which supplies a video signal to the pixel, a right side thereof defined by a current supply line PL which supplies an electric current to the pixel, and a lower side thereof defined by the gate signal line GL which selectively drives other neighboring pixel.

This one pixel region is divided into an upper side and a lower side in the drawing, wherein a light emitting layer formed of an organic EL layer is formed in the lower-side region and a circuit which forms an electric current corresponding to the video signal is formed in the upper-side region.

In the above-mentioned region where the light emitting layer is formed, for example, one electrode (indicated by ITO in the drawing) formed of a light transmitting conductive layer, the light emitting layer and another electrode are sequentially stacked from the substrate side. The light emitting layer is formed in a state that the light emitting layer is embedded in an opening portion of (BPM, OPN in the drawing) of a bank layer formed over the above-mentioned one electrode and this portion substantially constitutes a light emitting portion. Further, another electrode is formed in common with respect to respective pixels in a state that another electrode also covers an upper surface of the bank layer.

Using one electrode as the anode and another electrode as the cathode, when an electric current is made to flow between these electrodes, the light emitting layer is configured to emit light with intensity corresponding to the supplied electric current. Here, the bank layer is provided for obviating the transmission of the light emission from the pixel to the inside of the neighboring pixel or for forming the light emitting layer having fluidity originally in the manufacture step to have a given profile.

In the above-mentioned region formed in the above-mentioned circuit, switching elements SW1, SW2, SW3, a control signal line CL1 which turns on and off the switching element SW2, a control signal line CL2 which turns on and off the switching element SW3, a drive transistor DT, a capacitive elements C1-CSi, a capacitive element CSi-C2 are formed.

The circuit fetches the video signal from the data signal line DL in response to the scanning signal from the gate signal line GL, wherein depending on the magnitude (voltage) of the video signal, the electric current from the electric current supply line PL is supplied to one electrode in the region on which the light emitting layer is formed.

Here, the switching elements SW2, SW3 and the capacitive element CSi-C2 are provided, when a threshold value voltage of the drive transistor DT varies for every pixel, to correct irregularities.

Figure 10B:
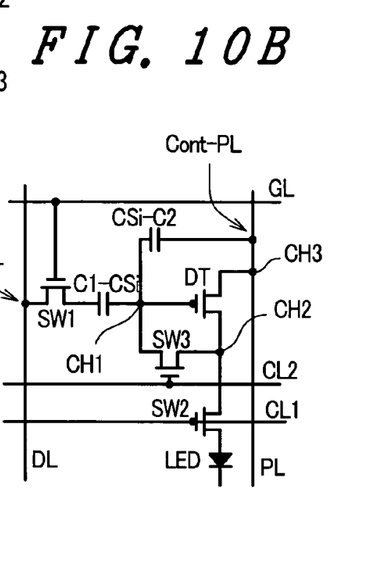
FIG. 10B shows an equivalent circuit of the respective pixel.

FIG. 10B shows an equivalent circuit in the above-mentioned one pixel and substantially corresponds to the geometrical arrangement shown in FIG. 10A.

The switching element SW1 is turned on in response to the scanning signal from the gate signal line GL and the video signal from the drain signal line DL is supplied to one electrode C1 of the capacitive element C1-CSi through the switching element SW1. Here, another electrode of the capacitive element C1-CSi is held in a floating state.

Here, the capacitive element C1-CSi has a function of holding the gate potential of the drive transistor DT having the gate electrode which has the equal potential as another electrode at a given value over a given period.

In such a state, first of all, the control signal transmitted through the control signal line CL1 turns on the switching element SW2. Here, although the drive transistor DT is not turned on, a node CH2 side of the drive transistor DT is connected to the reference potential through the organic EL element LED from the floating state and hence, the potential is elevated to a given value.

Next, the control signal which is transmitted through the control signal line CL2 turns on the switching element SW3 in response to the control signal. Accordingly, one electrode CSi of the capacitive element CSi-C2 in a floating state is connected with the node CH2 side of the drive transistor DT through the switching element SW3 and hence, a potential thereof is elevated to the above-mentioned given value. Here, the gate potential (the potential of the node CH1) of the drive transistor DT is equal to the potential of the output side (the node CH2) and hence, a channel layer of the drive transistor DT interrupts the flow of charge.

Since a given electric current flows in the current supply line PL irrelevant to the video signal transmitted through the data signal line DL, the potential is substantially fixed. Accordingly, by sequentially turning on two switching elements SW2, SW3 (allowing the respective channel layers to assume a conductive state), it is possible to enable the capacitive element CSi-C2 of every pixel to store the substantially same amount of charge.

In such a state, when the channel layer of the switching element SW3 is closed and, subsequently the switching element SW1 is turned on, corresponding to the voltage (video signal) applied to one electrode C1 of the capacitive element C1-CSi, the capacitance of the capacitive element C1-CSi is changed. In response to the change of capacitance, the difference is generated between the potential of the node CH1 (the gate potential of the drive transistor DT) and the potential on the output side (node CH2 side).

By turning on the drive transistor DT in response to the potential difference and by controlling an amount of charge which flows into the turned-on channel, it is possible to allow the organic EL element LED to emit light with the desired brightness.

The above-mentioned respective embodiments may be used in a single form respectively or in combination. This is because that it is possible to obtain the advantageous effects of the respective embodiments in a single form or synergistically.

What is clamed is:

1. A display device being characterized in that the display device includes a display part and a display drive circuit which is formed on a periphery of the display part on a surface of a substrate, wherein
   the display part includes a plurality of pixels driven by the display drive circuit,
   each one of the pixels is formed of a stacked body which is constituted of at least a first electrode, a light emitting layer and a second electrode stacked from the substrate side,
   the second electrodes of respective pixels are electrically connected in common, and
   a conductive layer and the second electrodes are formed in a common layer, the conductive layer is made of the same material as the second electrodes, the conductive layer is formed on a region other than the display part in a state that the conductive layer is electrically separated from the second electrodes.

2. A display device according to claim 1, wherein the conductive layer is formed over the display drive circuit by way of an insulation film in a state that a portion of the conductive layer is overlapped to the display drive circuit.

3. A display device according to claim 1, wherein the conductive layer is formed over the display drive circuit by way of an insulation film in a state that a portion of the conductive layer is not overlapped to the display drive circuit.

4. A display device according to claim 1, wherein the conductive layer is formed over the display drive circuit by way of an insulation film in a state that the conductive layer is not overlapped to the display drive circuit.

5. A display device according to claim 1, wherein the conductive layer is formed of a wiring layer.

6. A display device according to claim 1, wherein the conductive layer also functions as one electrode of a capacitive element.

7. A display device being characterized in that the display device includes a display part and a display drive circuit which is formed on a periphery of the display part on a surface of a substrate, wherein
   the display part includes a plurality of pixels driven by the display drive circuit, each one of the pixels is formed of a stacked body which is constituted of at least a first electrode, a light emitting layer and a second electrode stacked from the substrate side, the second electrodes of respective pixels are electrically connected in common, and a conductive layer and the second electrodes are formed in a common layer, the conductive layer is made of the same material as the second electrodes, the conductive layer is formed on a region of the display part in a state that the conductive layer is electrically separated from the second electrodes.

8. A display device according to claim 7, wherein the conductive layer is formed of a wiring layer.

9. A display device according to claim 7, wherein the conductive layer also functions as one electrode of a capacitive element.

* * * * *